United States Patent
Kintis et al.

(10) Patent No.: US 6,662,018 B1
(45) Date of Patent: Dec. 9, 2003

(54) ANALOG POWER CONTROL SYSTEM FOR A MULTI-CARRIER TRANSMITTER

(75) Inventors: Mark Kintis, Manhattan Beach, CA (US); Donald R. Martin, Redondo Beach, CA (US); Vincent C. Moretti, Torrance, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 464 days.

(21) Appl. No.: 09/605,022

(22) Filed: Jun. 28, 2000

(51) Int. Cl.$^7$ .............................. H04B 7/00; H03G 3/20
(52) U.S. Cl. ....................... 455/522; 455/103; 455/127; 330/124 R; 330/129; 330/284; 330/295
(58) Field of Search ................................. 455/103, 127, 455/522; 330/124 R, 129, 284, 295

(56) References Cited

U.S. PATENT DOCUMENTS

| | | | | |
|---|---|---|---|---|
| 5,199,110 A | * | 3/1993 | Adachi ........................ | 455/126 |
| 6,049,707 A | * | 4/2000 | Buer et al. ................... | 455/314 |
| 6,055,418 A | * | 4/2000 | Harris et al. .................. | 455/91 |
| 6,124,758 A | * | 9/2000 | Korte et al. ............ | 330/124 R |
| 6,335,660 B1 | * | 1/2002 | Frecassetti et al. .......... | 330/149 |

* cited by examiner

*Primary Examiner*—Nguyen T. Vo
*Assistant Examiner*—David Nguyen
(74) *Attorney, Agent, or Firm*—John A. Miller; Warn, Burgess & Hoffmann, P.C.

(57) ABSTRACT

A power control system for a multi-carrier base station transmitter is capable of controlling power levels of individual RF carriers. The power control system has a multi-channel amplification system for converting a plurality of analog input signals into a plurality of amplified carrier signals. The amplification system also generates a plurality of reference signals corresponding to the amplified carrier signals. Furthermore, the amplification system generates a multi-carrier signal, where the multi-carrier signal includes a summation of the amplified carrier signals. A correlating power detection system is connected to the amplification system, where the correlating power detection system generates total power control signals based on the reference signals and the multi-carrier signal. The power control system also has an adjustment module connected to the amplification system and the power detection system, where the adjustment module controls amplification of the carrier signals based on the total power control signals. Sampling the amplified signals to obtain reference signals, and using these reference signals for control purposes allows greater power control than available under conventional approaches.

14 Claims, 4 Drawing Sheets

ANALOG POWER CONTROL SYSTEM FOR A MULTI-CARRIER TRANSMITTER

BACKGROUND OF THE INVENTION

1. Field of the Invention

The present invention relates generally to wireless communications. More particularly, the present invention relates to a power control system for a multi-carrier base station transmitter, having a correlating power detection system for individually controlling the power levels of an arbitrary number of RF carriers.

2. Discussion of the Related Art

Wireless communication systems require the coordination of a number of devices such as base stations, controllers, and mobile subscriber equipment. Base stations generally function as an interface between the subscriber equipment and the controllers in a given network. Therefore, the typical base station must both transmit and receive RF signals to and from the other components of the network.

A particularly challenging requirement of base station transmitters is power control. For example, in a spread spectrum protocol such as CDMA, a given multi-carrier signal will contain information that is simultaneously transmitted to subscribers that are both near and far away from the transmitter. In order to avoid significant interference problems throughout the entire coverage area, it is crucial that the power control system be able to set the power levels of the individual RF carriers to a high level of precision. This requirement is primarily due to multi-path effects and is well documented in the industry. Conventional systems, however, either have inadequate individual power control, or use elaborate dedicated systems for each RF carrier. It is easy to understand that the complicated nature of the dedicated systems approach significantly increases the costs of the power control system as well as the overall transmitter. It is therefore desirable to provide a power control system for a base station transmitter that uses a shared system to control the power level of individual RF carriers in a multi-carrier system.

Another concern regarding conventional power control systems is saturation. Generally, a typical power control system will have a multi-channel power amplifier that amplifies a summation of the individual RF carrier signals before transmission. Each RF carrier signal will have a distinct frequency. The resulting plurality of frequencies in the multi-carrier signal leads to distortion and an increase in the overall power encountered by the multi-channel power amplifier. If the power levels of the individual carriers are not tightly controlled, the multi-channel power amplifier can be driven into saturation. The result can be a significant degradation in the received signal.

Conventional systems also fail to adequately address the fact that the temperature of the power detection system is also directly related to the ability to control the transmitted power. For example, if an I/Q detector is used to generate an in phase power signal and a quadrature signal, the mixing components of the I/Q detector are slightly temperature dependent. The result may lead to inaccurate power measurement and therefore, inaccurate power control. It is therefore highly desirable to provide a power control system that does not result in saturation, and is able to account for system temperature fluctuations.

SUMMARY OF THE INVENTION

The above and other objectives are achieved by an analog-based power control system for a multi-carrier base station transmitter in accordance with the present invention. The power control system has a multi-channel amplification system for converting a plurality of analog input signals into a plurality of amplified carrier signals. The amplification system also generates a plurality of reference signals corresponding to the amplified carrier signals. Furthermore, the amplification system generates a multi-carrier signal and samples the multi-carrier signal, where the multi-carrier signal includes a summation of the amplified carrier signals. A correlating power detection system is connected to the amplification system, and generates total power control signals based on the reference signals and the sampled multi-carrier signal. The control system further includes an adjustment module connected to the amplification system and the power detection system. The adjustment module controls amplification of the carrier signals based on the total power control signals.

Further in accordance with the present invention, a digital-based power control system is provided. The power control system includes a multi-channel conversion system, a correlating power detection system, and a feedback conversion module. The multi-channel conversion system generates a plurality of analog reference signals corresponding to a plurality of digital input signals. The multi-channel conversion system also generates an analog multi-carrier signal and samples the multi-carrier signal, where the multi-carrier signal represents an amplified summation of the digital input signals. The correlating power detection system is connected to the multi-channel conversion system and generates digital total power control signals based on the analog reference signals and the analog sampled multi-carrier signal. The feedback conversion module is connected to the multi-channel conversion system and the correlating power detection system and individually controls amplification of the digital input signals based on the total power control signals.

BRIEF DESCRIPTION OF THE DRAWINGS

Additional objects, features, and advantages of the present invention will become apparent from the following description and the appended claims when taken in connection with the accompanying drawings, wherein:

DETAILED DESCRIPTION OF THE PREFERRED EMBODIMENTS

1. Analog-based Power Control System

Figure 1:
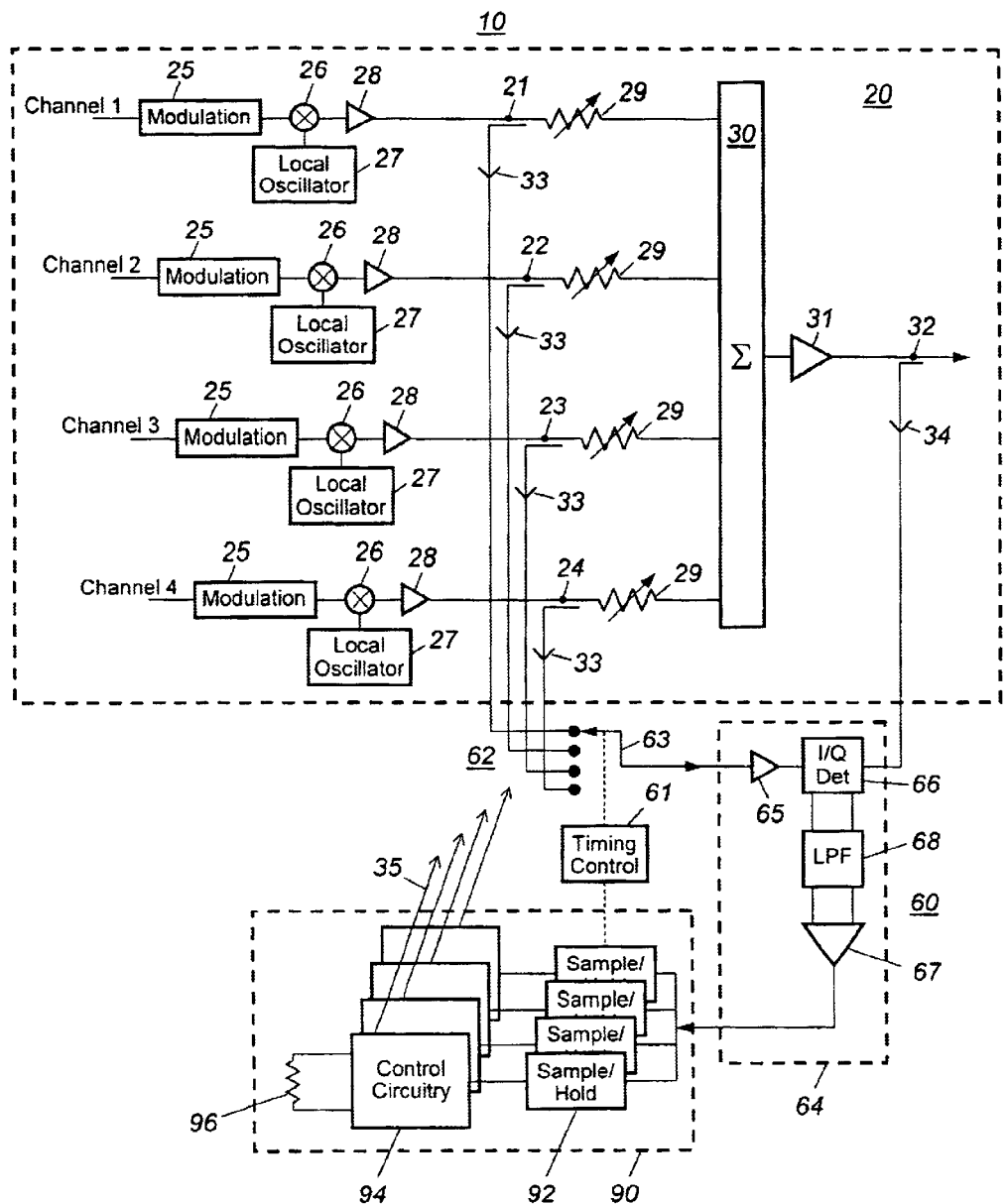
FIG. 1 is a block diagram of an analog-based power control system in accordance with a preferred embodiment of the present invention.

FIG. 1 shows a preferred analog-based power control system 10 for a multi-carrier transmitter in accordance with the present invention. Generally, the power control system 10 provides a base station transmitter with the ability to individually control the transmitted power level of each carrier signal to a high degree of accuracy. While the preferred embodiment is described with respect to a cellular base station transmitter, the present invention is readily applicable to any type of multi-carrier transmitter. It can be seen that control system 10 has a multi-channel amplification system 20, a correlating power detection system 60, and an adjustment module 90. While the preferred control system 10 is shown to have a four-channel capacity, the control system 10 can be readily modified to accept a larger or smaller number of channels without parting from the spirit and scope of the invention. The multi-channel amplification system 20 converts a plurality of analog input signals corresponding to channels 1 through 4 into a plurality of amplified carrier signals. The amplification system 20 also generates a plurality of reference signals corresponding to the amplified carrier signals. This can be done by tapping a small amount of power from reference points 21, 22, 23, and 24. The amplification system 20 further generates a sampled multi-carrier signal, where the multi-carrier signal includes a summation of the amplified carrier signals. The sampled multi-carrier signal can be obtained by tapping a small amount of power from summation point 32.

The correlating power detection system 60 is connected to the amplification system 20, and generates total power control signals based on the reference signals and the sampled multi-carrier signal. The adjustment module 90 is connected to the amplification system 20 and the power detection system 60, and controls amplification of the carrier signals based on the total power control signals. Thus, the present invention provides a unique shared architecture for individually controlling the transmitted power of individual carrier signals. Such an approach significantly improves overall power control and reduces the occurrence of saturation.

It is important to note that the term "connected" is used herein for ease of discussion and is not used in the physical sense per se. Thus, the connections described can be of an electrical, optical, or electromagnetic nature, or can be any other suitable mechanism for transferring the signal in question. The detection and control signals may be represented in analog or digitally.

2. Multi-channel Amplification System

It will be appreciated that a number of approaches can be taken to implementing the above-described components. For example, the preferred amplification system 20 has a modulator 25 corresponding to each input signal, where the modulators 25 encode the input signals in accordance with a predetermined modulation protocol. Example protocols include QPSK, QAM, GMSK, CDMA, and TDMA. The present invention is therefore not limited to any particular protocol, and can be used in a wide range of wireless or other multi-channel transmit applications. A multiplier 26 is connected to each modulator 25 and a local oscillator 27. The multipliers 26 multiply the encoded input signals by frequency conversion signals to move the encoded input signals to desired frequencies. This results in the generation of the carrier signals. For example, a typical input signal of a few megahertz might be "up-converted" to an approximately 1820 MHz carrier signal with a signal bandwidth of 200 kHz.

It can be seen that an amplifier 28 is connected to each multiplier 26 for amplifying the carrier signals, and a voltage-controlled attenuator 29 is preferably connected to each amplifier 28 and to the adjustment module 90. The attenuator 29 attenuates the amplified carrier signal based on an attenuation control signal 35 from the adjustment module 90. It is important to note that the attenuator 29 can be replaced by a variable gain amplifier for the same purpose. In such a case, a gain control signal would be appropriate as a control mechanism. A summation module 30 is connected to the attenuators 29 for summing the amplified carrier signals, and a multi-channel power amplifier 31 is connected to the summation module 30. The multi-channel power amplifier 31 amplifies the multi-carrier signal. It is preferred that the amplification system 20 further includes a plurality of reference amplifiers 33, and a summation amplifier 34. The reference amplifiers 33 amplify the reference signals to desired levels and the summation amplifier 34 amplifies the sampled multi-carrier signal to a desired level.

3. Correlating Power Detection System

Figure 2:
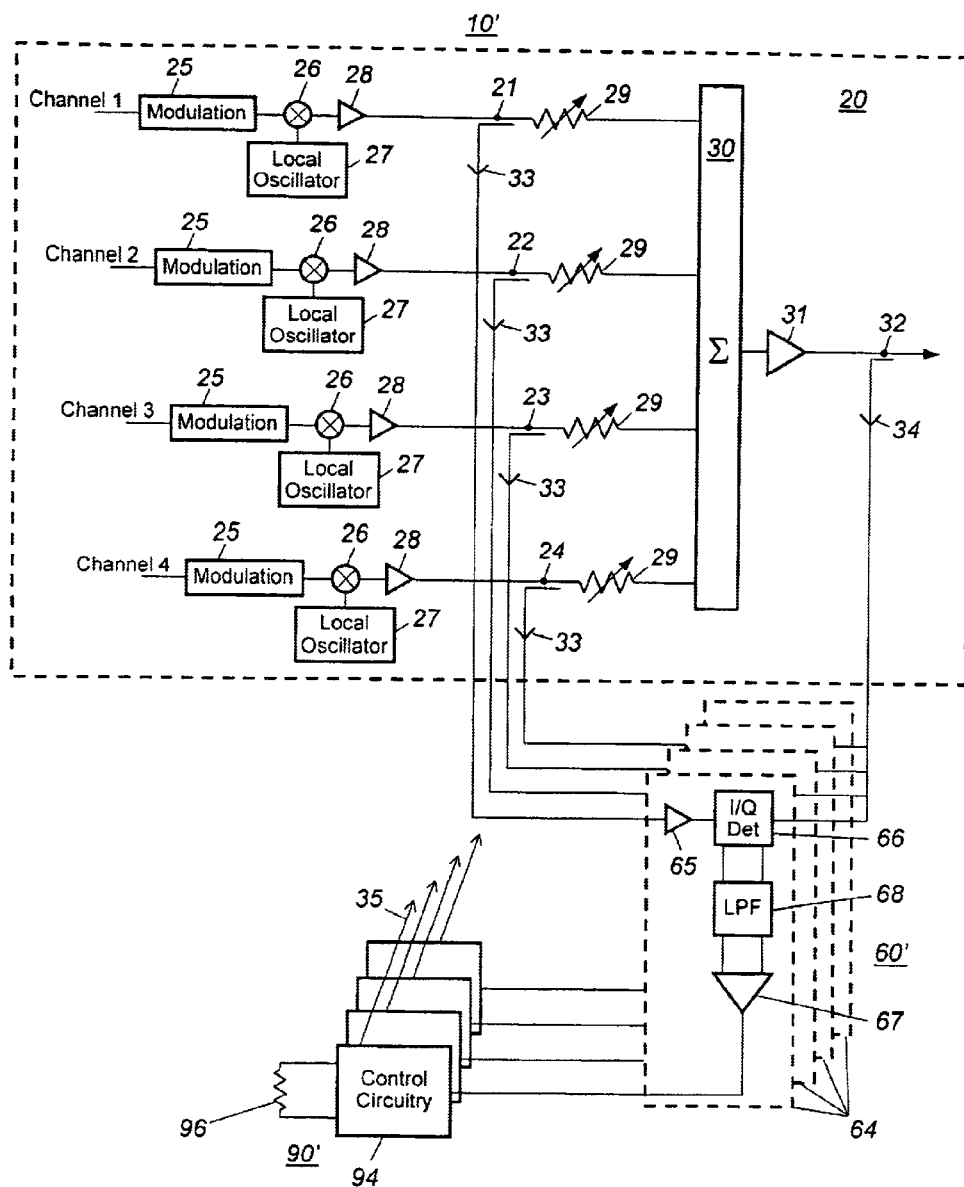
FIG. 2 is a block diagram of an analog-based power control system in accordance with an alternative embodiment of the present invention.

As already noted, the correlating power detection system 60 generates total power control signals based on the reference signals and the sampled multi-carrier signal. The correlating power detection system 60 may either be made up of a switching system 62 and a correlating power detector 64 (FIG. 1), or a plurality of correlating power detectors 64, where each power detector 64 corresponds to one of the reference signals (FIG. 2). The alternative analog-based power control system 10' will be described later. FIG. 1 demonstrates the approach of using a switching system 62.

With continuing reference to FIG. 1, the preferred switching system 62 will now be described. Specifically, it can be seen that the switching system 62 is connected to the multi-channel amplification system 20 for selecting an active reference signal from the plurality of reference signals. Thus, the active reference signal in FIG. 1 corresponds to the carrier signal for Channel 1. The switching system 62 has a timing controller 61 for generating a switching signal, and a switching mechanism 63 connected to the multi-channel amplification system 20, the correlating power detector 64, and the timing controller 61. The switching mechanism selects the active reference signal based on the switching signal, and can be any number of commercially available devices well known in the art.

The correlating power detector 64 is connected to the switching system 62 and the multi-channel amplification system 20. The power detector 64 generates each total power control signal based on the active reference signal and the multi-carrier signal. In the preferred embodiment, the power detector 64 has a power limiter 65 connected to the switching system 62 for setting a fixed power level of the active reference signal. The main purpose of this is to improve the comparison function to be described below.

An I/Q detector 66 is connected to the limiter 65 and the multi-channel amplification system 20. It is important to note that the active reference signal will contain both phase and frequency information. The phase information results from the modulation activities described above. The frequency information similarly results from the up-conversion described above. The I/Q detector 66 therefore generates an in phase power signal and a quadrature power signal based on the active reference signal and the multi-carrier signal. It is important to note that any power in the multi-carrier signal and the active reference signal having the same frequency will be a direct current (DC) component of the in phase and in quadrature power signals. Thus, for the example illustrated in FIG. 1, the power signals will have a DC component corresponding to the power transmitting on Channel 1.

Thus, a low pass filter 68 can be connected to the I/Q detector 66 for filtering the unwanted frequencies from the power signals such that DC power signals result. One DC power signal corresponds to the in phase power and the other DC power signal corresponds to the quadrature power. Preferably, a summing amplifier 67 is connected to the low pass filter 68 for combining the DC power signals. Specifically, the summing amplifier 67 squares, sums, and integrates the DC power signals to obtain the total power control signals. Each total power control signal represents the transmitted power level for the selected channel. It will be appreciated that an operational amplifier can also be used for this purpose. In fact, these functions can be performed digitally as well as in analog. In such a case, the summing amplifier 67 would be replaced by an A/D converter and commercially available digital signal processing circuitry well known in the industry.

FIG. 2 demonstrates that in the alternative embodiment of providing a power detector 64 for each one of the reference signals (i.e. channels), the power detectors 64 will be directly connected to the multi-channel amplification system 20.

4. Adjustment Module

Returning now to FIG. 1, it can be seen that the preferred adjustment module 90 has a plurality of sample and hold circuits 92 for storing the total power control signals based on a switching signal from the correlating power detection system 60. Control circuitry 94 generates attenuation control signals 35 based on the total power control signals and predetermined power data. This power data will essentially include information linking desired power levels to transmitted power levels for various frequencies. The control circuitry 94 can be implemented with lookup tables, automatic gain control loops, or any other control mechanism capable of generating either a gain or an attenuation signal based on the power data. It can also be seen that the control circuitry 94 may also include a temperature sensing device such as thermistor 96 for generating a temperature signal based on a temperature of the correlating power detection system. Specifically, the multipliers in the I/Q detector 66 may be temperature dependent. In this case, the control circuitry 94 also generates the attenuation control signals 35 based on the temperature signal from the thermistor 96.

As shown in FIG. 2, it will further be appreciated that where the correlating power detection system 60 includes a plurality of detectors 64, the power in each channel is continuously monitored and the adjustment module 90' does not require sample and hold circuits. The adjustment module 90' therefore merely includes the plurality of control circuitry 94 and the thermistor 96, if desired.

5. Digital-based Power Control System

It is important to note that while the above-described power control systems 10 and 10' are geared towards analog input signals, it may be necessary to process digital input signals. The digital input signals include channel frequency, power level, and other digital data necessary for transmission. Thus, FIGS. 3 and 4 describe a preferred digital-based power control system 100, and an alternative digital-based power control system 100'.

Figure 3:
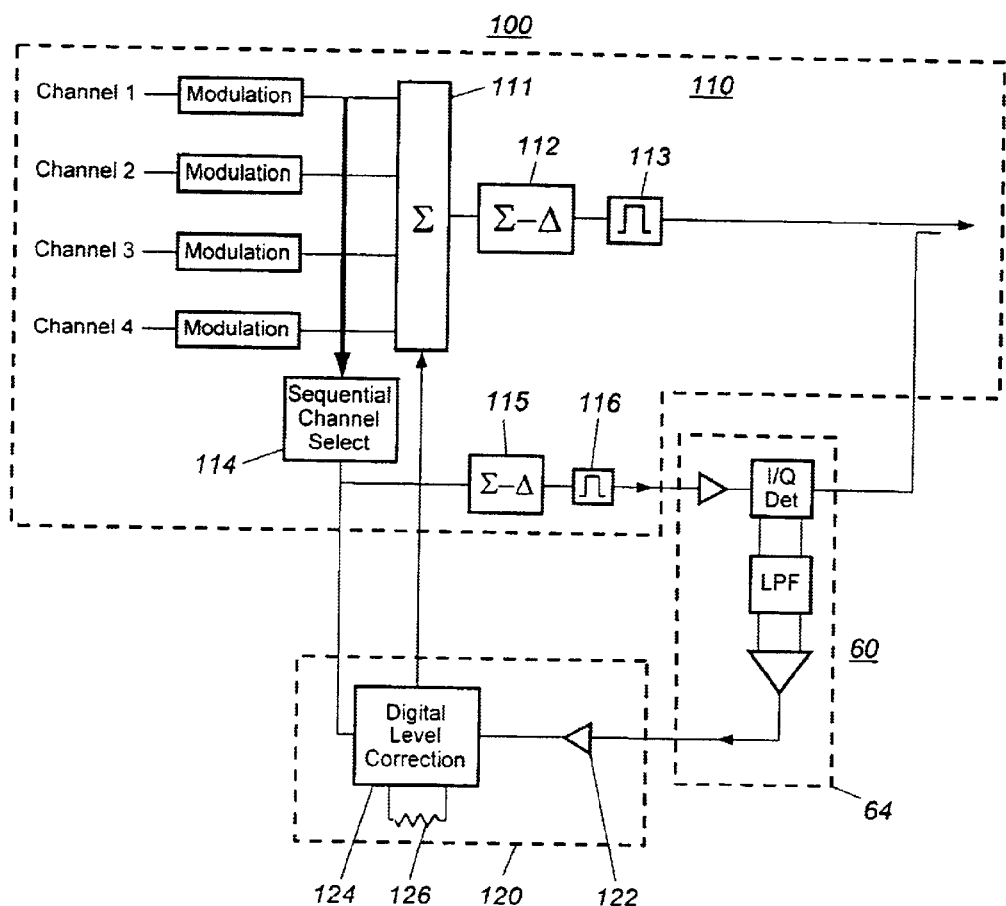
FIG. 3 is a block diagram of a digital-based power control system in accordance with a preferred embodiment of the present invention.

With continuing reference to FIG. 3, it can be seen that the power control system 100 has a multi-channel conversion system 110 for generating a plurality of analog reference signals corresponding to a plurality of digital input signals. The multi-channel conversion system 110 further generates an analog multi-carrier signal and samples the multi-carrier signal. The multi-carrier signal represents a summed amplification of the digital input signals. A correlating power detection system 60 is connected to the multi-channel conversion system 110 and generates total power control signals based on the reference signals and the sampled multi-carrier signal. The control system 100 also includes a feedback conversion module 120 connected to the multi-channel conversion system 110 and the correlating power detection system 60. The feedback conversion module 120 individually controls amplification of the digital input signals based on the total power control signals from the correlating power detection system 60.

6. Multi-channel Conversion System

Figure 4:
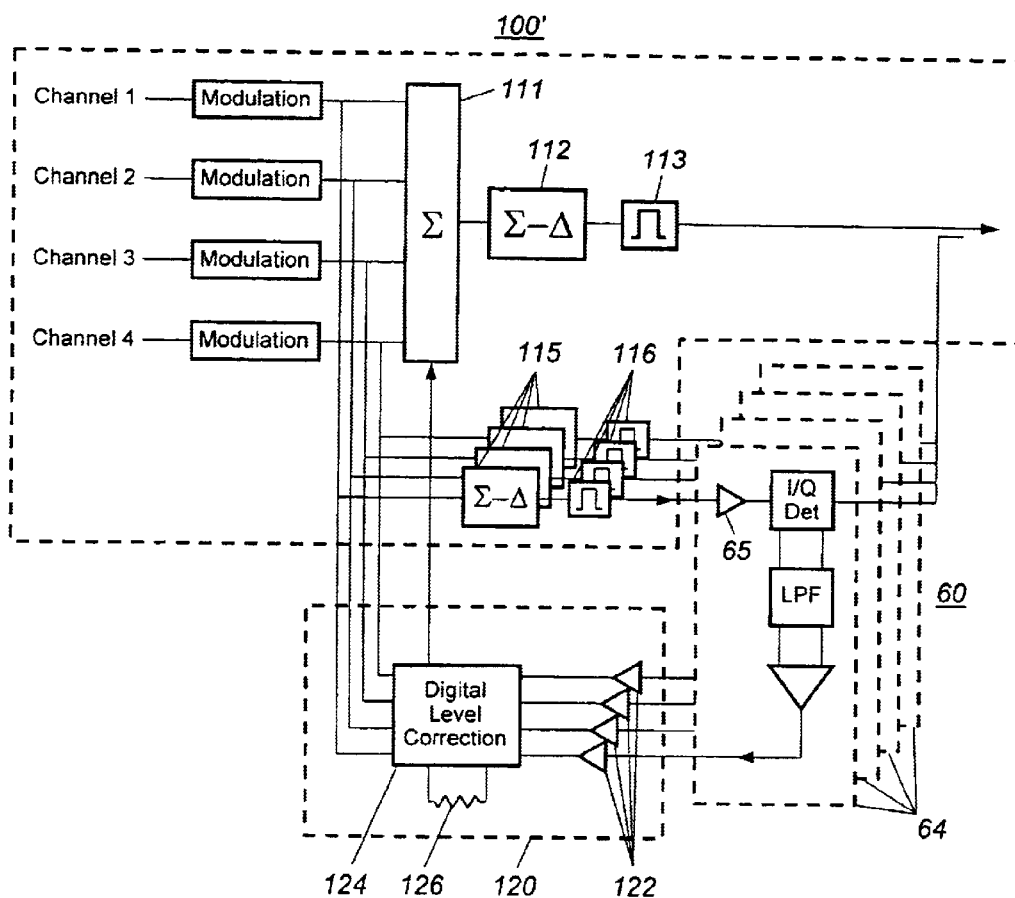
FIG. 4 is a block diagram of a digital-based power control system in accordance with an alternative embodiment of the present invention.

It will be appreciated that a number approaches can be taken to implementing the above-described components. For example, the multi-channel conversion system 110 can provide the reference signals to the correlating power detection system 60 serially (as shown in FIG. 3), or in parallel (as shown in FIG. 4). With continuing reference to FIG. 3, it can be seen that a digital summer 111 digitally amplifies the input signals based on a digital attenuation (or gain) control signal. The digital summer 111 also sums the amplified digital input signals to generate a digital multi-carrier signal. A multi-carrier A/D converter 112 is coupled to the digital summer 111 for converting the digital multi-carrier signal into a multi-carrier pulse stream. The preferred converter 112 is a delta sigma converter that generates a pulse width modulated bit stream. A multi-carrier filter 113 is connected to the multi-carrier A/D converter 112 for converting the multi-carrier pulse stream into the analog multi-carrier signal. The filter 113 is preferably a bandpass filter having the desired center frequency and bandwidth.

The preferred multi-channel conversion system 110 further includes a channel selection module 114 for selecting an active input signal from the plurality of digital input signals. A single carrier D/A converter 115 is coupled to the channel selection module 114 for converting the active input signal into an active reference pulse stream. This converter 1 15 is also preferably a delta sigma converter. The conversion system 110 further includes a single carrier filter 116 connected to the single carrier D/A converter 115 for converting the active reference pulse stream into an active analog reference signal. This signal can be used by the correlating power detection system 60 in measuring the transmitted power as described in the above analog-based discussion.

Turning now to FIG. 4, the alternative digital-based power control system 100' is shown. It can be seen that the control system 100' is very similar to the one shown in FIG. 3, except for the number of number of single carrier D/A converters 115 and single channel filters 116, and the lack of a channel selection module 114. Specifically, FIG. 4 demonstrates that a plurality of single carrier D/A converters 115, corresponding to the plurality of digital input signals, convert the digital input signals into a plurality of reference pulse streams. A plurality of single carrier filters 116 are therefore connected to the single carrier D/A converters 115 for converting the reference pulse streams into analog reference signals. While this approach requires more components, certain processing advantages may be obtained by eliminating the channel selection module 114 (FIG. 3).

7. Feedback Conversion Module

It will also be appreciated that the feedback conversion module 120 can be implemented in a number of different ways. For example, FIG. 3 demonstrates that if the correlating power detection system 60 generates the total power control signals serially, the feedback conversion module 120 will include an A/D converter 122, and a digital level correction module 124. Specifically, the A/D converter 122 is connected to the correlation power detection system 60 for converting the total power control signals into digital feedback signals. The digital level correction module 124 is coupled to the A/D converter for generating digital control signals based on the digital feedback signals and predetermined power data.

As discussed above, the feedback conversion module 122 can further include a temperature sensing device such as thermistor 126 for generating a temperature signal based on a temperature of the correlating power detection system 60. In such a case, the digital level correction module further generates the digital control signals based on the temperature signal.

Turning now to FIG. 4, an alternative feedback conversion module 120' is shown. Specifically, it can be seen that the correlating power detection system 60 generates the total power control signals in parallel. Thus, the feedback conversion module 120' has a plurality of A/D converters 122 and a digital level correction module 124. The A/D converters are connected to the correlating power detection system 60 for converting the total power control signals into feedback signals. As described above, the digital level correction module 124 is coupled to the A/D converters for generating digital control signals based on the digital feedback signals and predetermined power data. The feedback conversion module 120 may also include the thermistor 26 as already discussed.

The present invention therefore allows individual RF carrier levels to be recovered via I/Q downconverting the multi-carrier spectrum either in parallel or serially by mixing the multi-carrier output with the individual carriers. It is important to note that the individual carriers can be either modulated or unmodulated. This provides the ability to individually control and monitor the power of an arbitrary number of RF carriers in a multi-carrier transmitter. Such a system will be useful in next generation cellular basestation products and provide reduced complexity and costs.

What is claimed is:

1. A power control system for a multi-carrier transmitter, the power control system comprising:
    a multi-channel amplification system for converting a plurality of analog input signals into a plurality of amplified carrier signals having different frequencies, said amplification system generating a plurality of reference signals corresponding to the amplified carrier signals, the amplification system further generating a multi-carrier signal and sampling the multi-carrier signal, where the multi-carrier signal includes a summation of the amplified carrier signals;
    a correlating power detection system connected to the amplification system, the correlating power detection system generating total power control signals based on the reference signals and the sampled multi-carrier signal; and
    an adjustment module connected to the amplification system and the power detection system, the adjustment module independently controlling amplification of the carrier signals based on the total power control signals before the amplified carrier signals are summed to generate the multi-carrier signal.

2. The power control system of claim 1 wherein the amplification system includes:
    a modulator corresponding to each input signal, the modulators encoding the input signals in accordance with a predetermined modulation protocol;
    a multiplier connected to each modulator and a frequency conversion module, the multipliers multiplying the encoded input signals by frequency conversion signals to move the encoded input signals to desired frequencies such that the carrier signals are generated;
    an amplifier connected to each multiplier for amplifying the carrier signals;
    a voltage controlled attenuator connected to each amplifier and to the adjustment module for attenuating the amplified carrier signal based on an analog attenuation control signal from the adjustment module;
    a summation module connected to the attenuators for summing the amplified carrier signals; and
    a multi-channel power amplifier connected to the summation module for amplifying the multi-carrier signal.

3. The power control system of claim 2 wherein the amplification system further includes:
    a plurality of reference amplifiers for amplifying the reference signals; and
    a summation amplifier for amplifying the sampled multi-carrier signal.

4. The power control system of claim 1 wherein the correlating power detection system includes:
    a switching system connected to the multi-channel amplification system for selecting an active reference signal from the plurality of reference signals; and
    a correlating power detector connected to the switching system and the multi-channel amplification system for generating the total power control signals based on the active reference signal and the multi-carrier signal.

5. The power control system of claim 4 wherein the correlating power detector includes:
    a limiter connected to the switching system for setting a fixed power level of the active reference signal;
    an I/Q detector connected to the limiter and the multi-channel amplification system, the I/Q detector generating an in phase power signal and a quadrature power signal based on the active reference signal and the multi-carrier signal;
    a low pass filter connected to the I/Q detector for filtering frequencies from the power signals such that direct current power signals result; and
    a summing amplifier connected to the low pass filter for combining the direct current power signals into the total power control signal.

6. The power control system of claim 4 wherein the switching system includes:
    a timing controller for generating a switching signal; and
    a switching mechanism connected to the multi-channel amplification system, the correlating power detector and the timing controller for selecting the active reference signal based on the switching signal.

7. The power control system of claim 1 wherein the correlating power detection system includes:
    a plurality of correlating power detectors connected to the multi-channel amplification system for generating the total power control signals based on the reference signals and the multi-carrier signals;
    each said power detector corresponding to one of the reference signals.

8. The power control system of claim 7 wherein each correlating power detector includes:
    a limiter connected to the multi-channel amplification system for setting a fixed power level of the corresponding reference signal;

an I/Q detector connected to the limiter and the multi-channel amplification system, the I/Q detector generating an in phase power signal and a quadrature power signal based on the corresponding reference signal and the multi-carrier signal;

a low pass filter connected to the I/Q detector for filtering frequencies from the power signals such that a direct current power signals result; and a summing amplifier connected to the low pass filter for combining the direct current power signals into the total power control signal.

9. The power control system of claim 1 wherein the adjustment module includes control circuitry for generating an attenuation control signal based on the total power control signals and predetermined power data.

10. The power control system of claim 9 wherein the control circuitry includes a temperature sensing device for generating a temperature signal based on a temperature of the correlating power detection system, the control circuitry further generating the attenuation control signal based on the temperature signal.

11. The power control system of claim 1 wherein the adjustment module includes:

a plurality of sample and hold circuits for storing the total power control signals; and control circuitry for generating attenuation control signals based on the total power control signals and predetermined power data.

12. The power control system of claim 11 wherein the adjustment module further includes a temperature sensing device for generating a temperature signal based on a temperature of the correlating power detection system, the control circuitry further generating the attenuation control signals based on the temperature signal.

13. A power control system for a multi-carrier transmitter, the power control system comprising;

a multi-channel amplification system for converting a plurality of analog input signals Into a plurality of amplified carrier signals and generating a plurality of reference signals corresponding to the amplified carrier signals, the amplification system further generating a multi-carrier signal and sampling the multi-carrier signal, where the multi-carrier signal includes a summation of the amplified carrier signals;

a correlating power detection system connected to the amplification system, the correlating power detection system generating total power control signals based on the reference signals and the sampled multi-carrier signal, said correlating power detection system including a switching system connected to the multi-channel amplification system for selecting an active reference signal from the plurality of reference signal, and a correlating power detector connected to the switching system and the multi-channel amplification system for generating the total power control signals based on the active reference signal and the multi-carrier signals, said correlating power detector inducing a limiter connected to the switching system for setting a fixed power level of the active reference signal, an I/Q detector connected to the limiter and the multi-channel amplification system, the I/Q detector generating an in phase power signal and a quadrature power signal based on the active reference signal and the multi-carrier signal, a low pass fitter connected to the I/Q detector for filtering frequencies from the power signals such that direct current power signals result, and a summing amplifier connected to the low pass filter for combining the direct current power signals into the total power control signal; and an adjustment module connected to the amplification system and the power detection system, the adjustment module controlling amplification of the carrier signals based on the total power control signals.

14. A power control system for a multi-carrier transmitter, the power control system comprising:

a multi-channel amplification system for converting a plurality of analog input signals into a plurality of amplified carrier signals and generating a plurality of reference signals corresponding to the amplified carrier signals, the amplification system further generating a multi-carrier signal and sampling the multi-carrier signal, where the multi-carrier signal includes a summation of the amplified carrier signals;

a correlating power detection system connected to the amplification system, the correlating power detection system generating total power control signals based on the reference signals and the sampled multi-carrier signal, said correlating power detection system including a plurality of correlating power detectors connected to the multi-channel amplification system for generating the total power control signals based on the reference signals and the multi-carrier signals each power detector corresponding to one of the reference signals, and each correlating power detector including a limiter connected to the multi-channel amplification system for setting a fixed power level of the corresponding reference signal, an I/Q detector connected to the limiter and the multi-channel amplification system, the I/Q detector generating an in phase power signal and a quadrature power signal based on the corresponding reference signal and the multi-carrier signal, a low pass filter connected to the I/Q detector for filtering frequencies from the power signals such that a direct current power signals result, and a summing amplifier connected to the low pass filter for combining the direct current power signals into the total power control signal; and an adjustment module connected to the amplification system and the power detection system, the adjustment module controlling amplification of the carrier signals based on the total power control signals.

\* \* \* \* \*